United States Patent
Heller et al.

(10) Patent No.: US 10,289,552 B2
(45) Date of Patent: May 14, 2019

(54) STORAGE SYSTEM AND METHOD FOR FLUSH OPTIMIZATION

(71) Applicant: Western Digital Technologies, Inc., Irvine, CA (US)

(72) Inventors: Tal Heller, Alonay Abba (IL); Hadas Oshinsky, Kfar Saba (IL); Rotem Sela, Haifa (IL); Einav Zilberstein, Hod Hasharon (IL); Amir Shaharabany, Kochav Yair (IL); Yigal Eli, Tel Aviv (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/611,510

(22) Filed: Jun. 1, 2017

(65) Prior Publication Data

US 2018/0322051 A1  Nov. 8, 2018

Related U.S. Application Data

(60) Provisional application No. 62/500,913, filed on May 3, 2017.

(51) Int. Cl.
| | |
|---|---|
| *G06F 12/00* | (2006.01) |
| *G06F 12/0804* | (2016.01) |
| *G06F 12/0806* | (2016.01) |
| *G06F 12/0868* | (2016.01) |
| *G06F 12/0891* | (2016.01) |
| *G11C 7/20* | (2006.01) |

(52) U.S. Cl.
CPC ...... *G06F 12/0804* (2013.01); *G06F 12/0806* (2013.01); *G06F 12/0868* (2013.01); *G06F 12/0891* (2013.01); *G11C 7/20* (2013.01)

(58) Field of Classification Search
None
See application file for complete search history.

(56) References Cited

U.S. PATENT DOCUMENTS

| | | | |
|---|---|---|---|
| 8,006,027 B1 * | 8/2011 | Stevens | G06F 3/061 711/111 |
| 8,566,639 B2 * | 10/2013 | Moshayedi | G11C 5/141 714/14 |
| 9,632,711 B1 | 4/2017 | Obr | |
| 2003/0084252 A1 * | 5/2003 | Talagala | G06F 12/0866 711/135 |
| 2008/0005465 A1 | 1/2008 | Matthews | |
| 2011/0252201 A1 | 10/2011 | Koren | |

(Continued)

OTHER PUBLICATIONS

Pending U.S. Appl. No. 15/252,251, filed Aug. 31, 2016, 36 pages.

*Primary Examiner* — John A Lane
(74) *Attorney, Agent, or Firm* — Morgan, Lewis & Bockius LLP (57) ABSTRACT

A storage system and method are provided for flush optimization. In one embodiment, a storage system is provided comprising a cache, a non-volatile memory, and a controller. The controller is configured to: store, in the cache, data received from a host and to be written in the non-volatile memory; receive a command from the host to move the data stored in the cache into the non-volatile memory; without having executed the command, send a confirmation to the host that the command was executed; and execute the command after sending the continuation to the host.

19 Claims, 7 Drawing Sheets

(56) References Cited

U.S. PATENT DOCUMENTS

| | | | |
|---|---|---|---|
| 2012/0047332 A1* | 2/2012 | Bannon | G06F 12/0804 |
| | | | 711/135 |
| 2012/0089796 A1* | 4/2012 | Fukazawa | G06F 11/1441 |
| | | | 711/162 |
| 2015/0134857 A1 | 5/2015 | Hahn | |
| 2015/0220439 A1 | 8/2015 | Mickens | |
| 2016/0034188 A1 | 2/2016 | Bisht | |
| 2016/0179667 A1* | 6/2016 | Kumar | G06F 12/0804 |
| | | | 711/135 |
| 2016/0378672 A1* | 12/2016 | Dulloor | G06F 12/0891 |
| | | | 711/135 |
| 2017/0060668 A1* | 3/2017 | Farhan | G06F 11/0793 |
| 2017/0116213 A1* | 4/2017 | Jain | G06F 17/30513 |
| 2017/0168937 A1* | 6/2017 | Bahali | G06F 12/0804 |
| 2018/0060232 A1 | 3/2018 | Oshinsky et al. | |

\* cited by examiner

STORAGE SYSTEM AND METHOD FOR FLUSH OPTIMIZATION

CROSS-REFERENCE TO RELATED APPLICATION

This application claims priority to U.S. Patent Application No. 62/500,913, filed May 3, 2017, which is hereby incorporated by reference.

BACKGROUND

Some storage systems operate in a "cache mode," in which data sent to the storage system for writing in the storage system's non-volatile memory is first stored in a volatile write cache. While the storage system may send the host a "command completion" signal after receiving the write command, "command completion" does not necessary mean that the data associated with the write command has been written in non-volatile memory, as the data may still be stored in the volatile memory. In some situations (e.g., to maintain file system integrity), the host may want to make sure that data from all previous write commands sent to the storage system 100 (and indicated to have been "completed" by the storage system) have, indeed, been committed to non-volatile memory. To do this, the host can send a "flush command" to the storage system, which triggers the storage system to write the data that is stored in the volatile write cache into the non-volatile memory. After the storage system writes the data in the non-volatile memory and confirms the written data is reliable, the storage system acknowledges that the flush operation was successfully completed.

DETAILED DESCRIPTION

Overview

By way of introduction, the below embodiments relate to a storage system and method for flush optimization. In one embodiment, a storage system is provided comprising a cache, a non-volatile memory, and a controller. The controller is configured to: store, in the cache, data received from a host and to be written in the non-volatile memory; receive a command from the host to move the data stored in the cache into the non-volatile memory; without having executed the command, send a confirmation to the host that the command was executed; and execute the command after sending the confirmation to the host.

In some embodiments, the controller is configured to send the confirmation to the host only after receiving, from the host, an indication that the data in the cache is safe from loss due to power failure.

In some embodiments, the indication indicates that the host's battery is un-removable and indicates the power charging level of the host's battery.

In some embodiments, the controller is configured to execute the command after an expiration of a time delay.

In some embodiments, the storage system further comprises a capacitor configured to hold enough charge to power the storage system for more than the time delay.

In some embodiments, a length of the time delay is set by the host.

In some embodiments, the cache comprises storage class memory.

In some embodiments, the storage system further comprises a write command queue, and the controller is further configured to: prior to executing the command to move the data: determine if there is a write command in the write command queue; and in response to determining there is a write command in the write command queue, store, in the cache, data associated with the write command.

In some embodiments, the non-volatile memory comprises a three-dimensional memory.

In some embodiments, the storage system is embedded in the host.

In some embodiments, the storage system is removably connected to the host.

In another embodiment, a method for executing a flush command is provided that is performed in a storage system in communication with a host, wherein the storage system comprises a write cache. The method comprises receiving a command from the host to flush the write cache; sending an acknowledgement to the host that the cache was flushed even though the write cache was not flushed; and after a period of time after sending the acknowledgement, flushing the write cache, wherein the data flushed from the write cache after the period of time is different from the data that would have been flushed if the write cache was flushed prior to sending the acknowledgement.

In some embodiments, the method further comprises before sending the acknowledgement, receiving an indication from the host that the data in the write cache will not be lost due to power failure.

In some embodiments, the indication indicates that the host's battery is un-removable and indicates the power charging level of the host's battery.

In some embodiments, the method further comprises prior to flushing the write cache: determining if there is a write command in a write command queue in the storage system; and in response to determining there is a write command in the write command queue, storing, in the write cache, data associated with the write command.

In some embodiments, the write cache is flushed into a non-volatile, three-dimensional memory of the storage system.

In some embodiments, the storage system is embedded in the host.

In some embodiments, the storage system is removably connected to the host.

In another embodiment, a storage system is provided comprising a cache; a non-volatile memory; and means for sending a confirmation of execution of a flush command to a host even though the flush command was not executed, wherein the confirmation is sent after receiving, from the host, an assurance that there will not be a power loss from the host prior to the storage system later executing the flush command.

In some embodiments, the assurance comprises an indication that indicates that the host's battery is un-removable and the power charging level of the host's battery.

In some embodiments, the non-volatile memory comprises a three-dimensional memory.

Other embodiments are possible, and each of the embodiments can be used alone or together in combination. Accordingly, various embodiments will now be described with reference to the attached drawings.

Embodiments

Figures 1A, 1B:
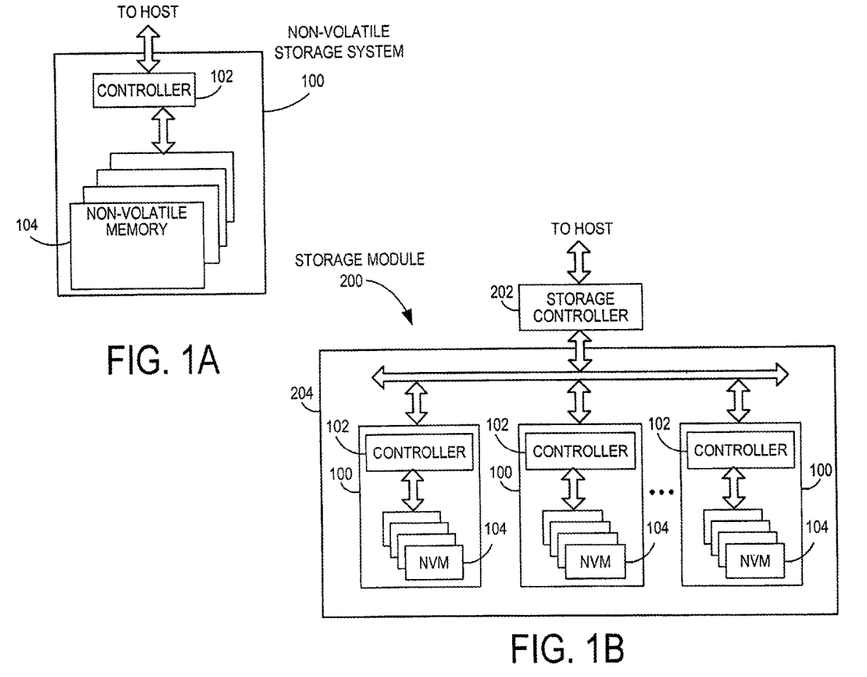
FIG. 1A is a block diagram of a non-volatile storage system of an embodiment.
FIG. 1B is a block diagram illustrating a storage module of an embodiment.
Figure 1C:
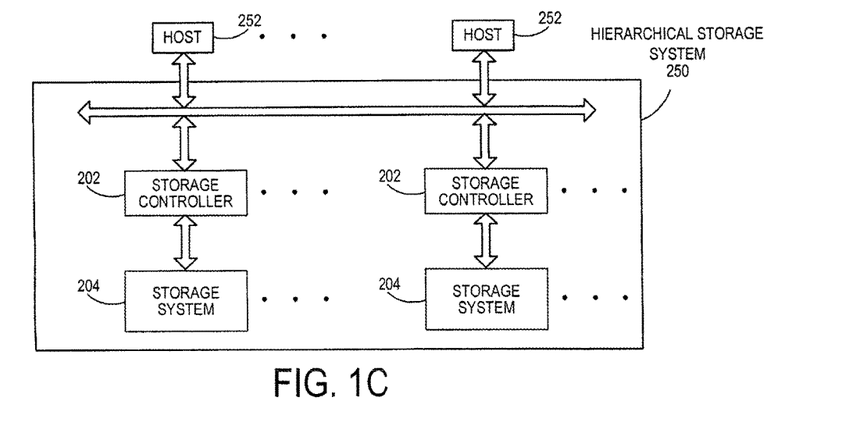
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it can communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
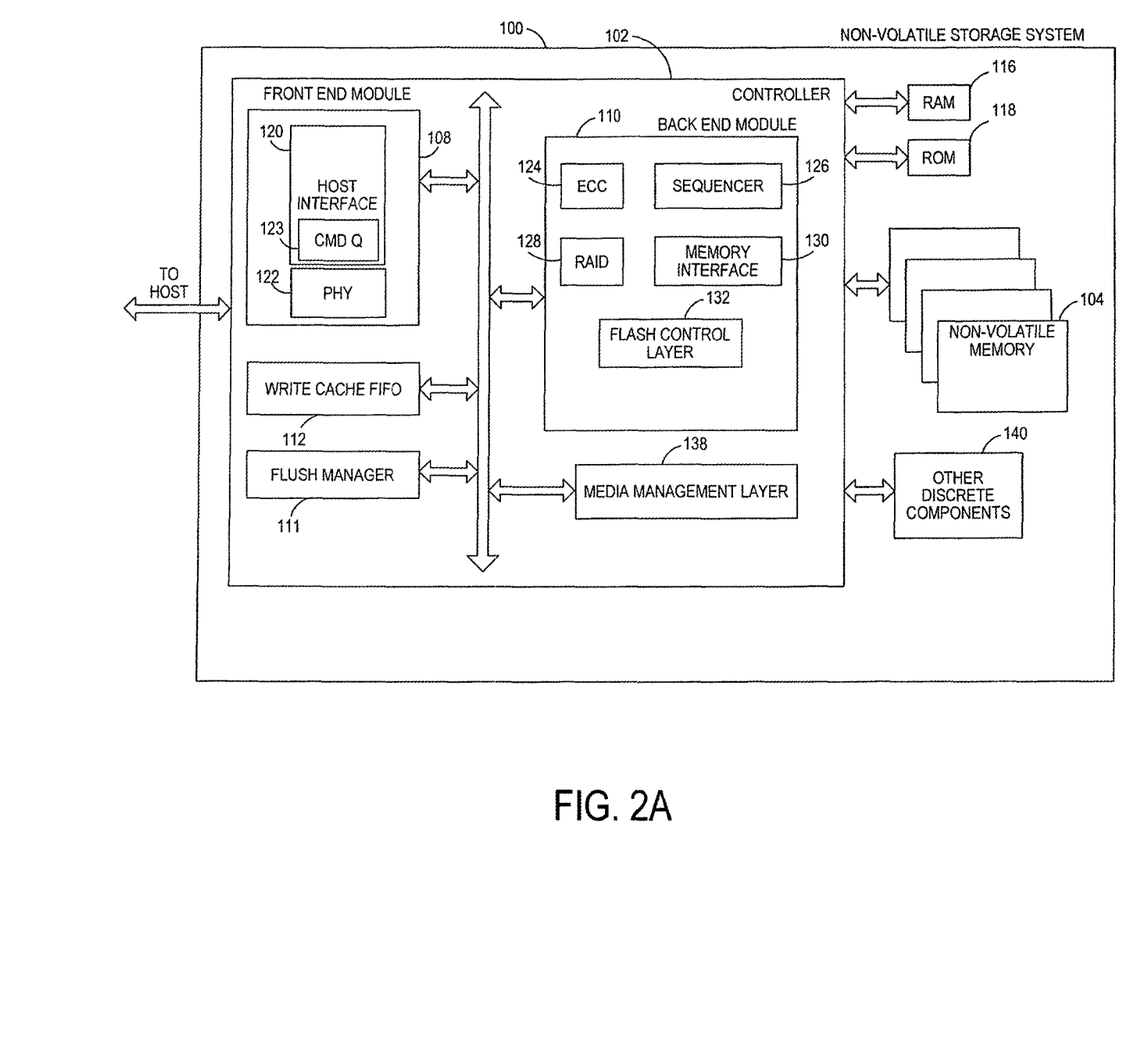
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a flush manager 111, which is discussed in more detail below, and can be implemented in hardware or software/firmware.

Referring again to modules of the controller 102, a buffer manager/bus controller manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 (here, with a command queue 123) and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals. The controller 102 also comprises a write cache FIFO (first in, first out), which can be implemented with volatile memory. In some embodiments, the write cache FIFO is implemented as RAM.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
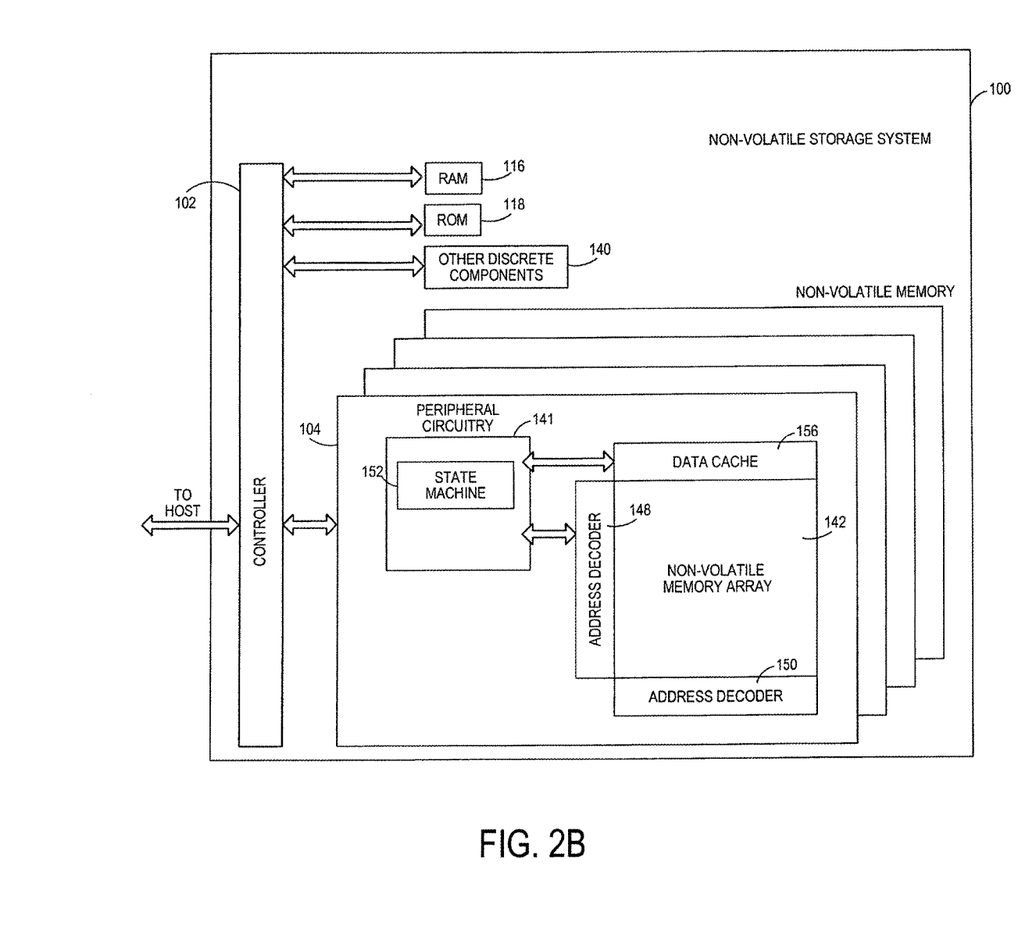
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

As indicated above, some storage systems operate in a "cache mode," in which data sent to the storage system for writing in the storage system's non-volatile memory is first stored in a volatile write cache. While the storage system may send the host a "command completion" signal after receiving the write command, "command completion" does not necessary mean that the data associated with the write command has been written in non-volatile memory, as the data may still be stored in the volatile memory. In some situations (e.g., to maintain file system integrity), the host may want to make sure that data from all previous write commands sent to the storage system 100 (and indicated to have been "completed" by the storage system) have, indeed, been committed to non-volatile memory. To do this, the host can send a "flush command" to the storage system, which triggers the storage system to write the data that is stored in the volatile write cache into the non-volatile memory. (As used herein, a flush command generally refers to a command that, when executed, moves the data stored in a write cache into non-volatile memory.) After the storage system writes the data in the non-volatile memory and confirms the written data is reliable, the storage system acknowledges that the flush operation was successfully completed.

The flush command is a "costly" operation in that the storage system needs to flush data in a write cache and then wait until the data that was sent to the non-volatile memory is indeed written. Waiting for the data to be written to the non-volatile memory can have a high latency. In addition, the throughput of the storage system may drop, as waiting for the data to be written to the non-volatile memory may require working in a non-optimal pipeline, which can cause a drop in system throughput to the non-volatile memory. Furthermore, some applications often use flush commands with a ratio of two or three host write commands per flush command. In such high flush command frequency, the write cache used to collect data for a full non-volatile page programming (e.g., 16K bytes or 32K bytes) may not be full. Hence, the storage system's full parallel performance capacity can be significantly reduced, where the high-frequency flush commands force programming of 4K bytes or 8K bytes at a time instead of 32K bytes, for example.

The following embodiments can be used to address this problem by reducing the penalty of flush operations (in both command-queue and non-command-queue systems) by responding positively to the host flush command (e.g., instantly upon receipt of the flush command or some time thereafter) but delaying the handling of the flush command (e.g., to a limited, pre-defined time window in the range of 0.5 milliseconds to a few milliseconds). FIGS. 3-6 will now be described to illustrate one example of this embodiment. It should be noted that this is merely one example, and other implementations can be used.

Figure 3:
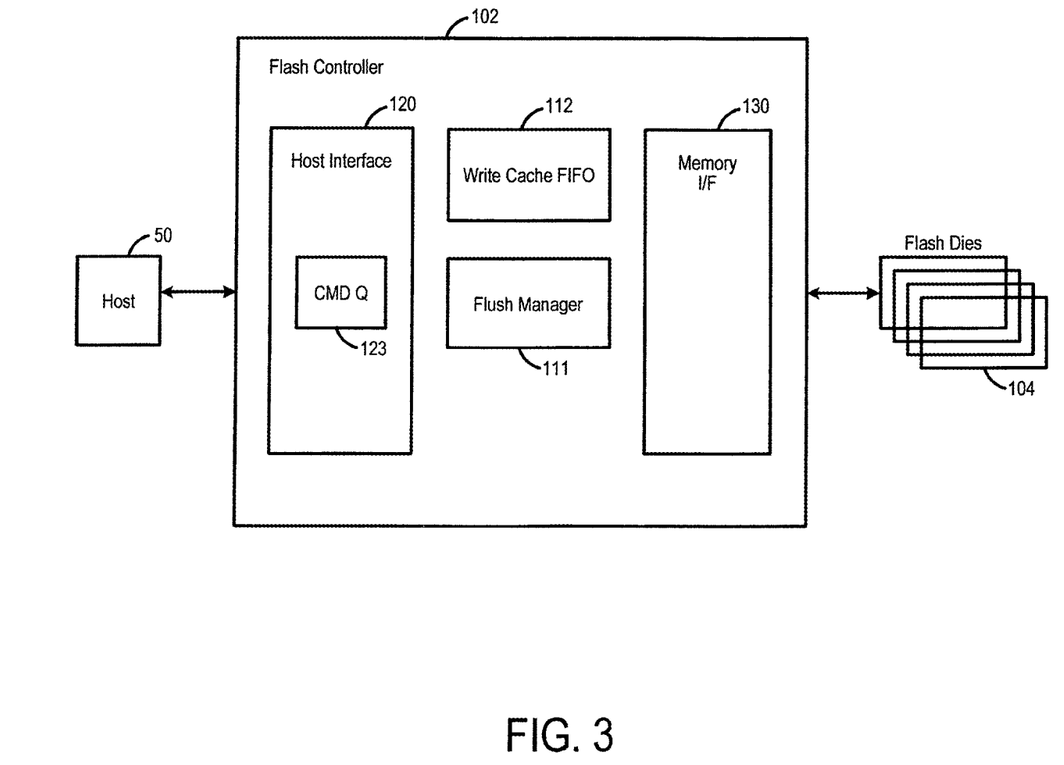
FIG. 3 is block diagram illustrating a host and storage system of an embodiment.

Turned first to FIG. 3, FIG. 3 is a block diagram of a host 50 and storage system 100 of an embodiment. For simplicity, FIG. 3 shows only some of the components that were shown in FIG. 2A. As shown in FIG. 3, the host 50 is in communication with a controller 102 (here, a flash controller), which comprises a host interface 120 with a command queue 123, a flush manager 111, a write cache FIFO 112, and a memory interface 130, which is in communication with one or more memory dies 104 (here, flash dies). In this embodiment, the write cache FIFO 112 guarantees that command execution is performed in a first-in-first-out order and allows filling host write data to the write cache 112 in order to program a full page to the non-volatile memory in parallel, providing high throughput. While a write cache FIFO is used in this example, it should be understood that any type of memory and organization can be used as the write cache. Accordingly, the write cache will sometimes be referred to herein as simply a write cache, a cache, or volatile memory. Also, as explained above, the flush manager 111 can be implemented in hardware and/or software/firmware. For example, in one embodiment, the controller 102 executes computer-readable program code (e.g., stored in the storage system 100) to implement the functions described below for the flush manager 111. More generally, the controller 102 is sometimes described herein as implementing the functions of the flush manager 111.

In one embodiment, after the controller 102 (e.g., the flush manager 111) receives a flush command from the host 50, it sends a confirmation to the host 10 that the flush command was executed—without actually having executed the command. (The confirmation can be sent immediately upon receipt of the flush command or at some time after receipt but before the flush command is executed.) Instead, at some point after sending the confirmation, the controller 102 executes the flush command. Again, one advantage of doing this is to allow more time to go by, during which more data may be stored in the write cache 112. That way, at the later time when the flush command is executed, more or different data will be committed to the non-volatile memory 104 than if the flush command was executed at the time the storage system 100 told the host 50 it was executed. For example, if the controller 102 can write a 32 Kbyte page of data to the non-volatile memory 104 but there is only 4 Kbytes of data in the write cache 112 at the time the flush command was received, the write would be inefficient, as the write operation only yields 4 Kbytes of data written instead of an entire 32 Kbyte page. In contrast, with this embodiment, during the delay in executing the flush operation, it is possible that an additional 28 Kbytes of data would be stored in the write cache 112, in which case, the write operation of the flush command would yields a full 32 Kbyte page of data. This increases the storage system's full parallel performance capacity by improving device throughput and benchmark performance. In this way, these embodiments can be used to improve storage system throughput, particularly for applications that generate flush commands with high frequency. Further, during the delay, it is possible that some of the data that would have been written earlier no longer needs to be written (e.g., because the data was deleted or modified). So, delaying execution of the flush command can avoid what may turn out to be data that does not need to be written after all. Accordingly, by waiting a period of time between sending the acknowledgement and flushing the write cache 112, the data eventually flushed from the write cache 112 may be different from the data that would have been flushed earlier.

The controller 102 can use any suitable way to determine how long to wait from the receipt of the flush command (or from when confirmation is sent to the host 50) before executing the flush command. For example, in one embodiment, the controller 102 (or some other component in the storage system 100) can implement a timer (e.g., based on clock pulses) to count out a time delay. The time delay can be, for example, pre-defined, random, variable based on certain conditions, etc. In another embodiment, instead of the time delay being set by the storage system 100, the host 50 can send the controller 102 the amount of time that the controller 102 should delay before executing the flush command. In this way, if the host's power condition is such that it cannot ensure providing the storage system 100 with power for an extended time, the host 50 can set the delay to be within the amount of time it knows it can provide power for the storage system 100 to commit the data to the non-volatile memory 104. Also, if the host 50 knows that it cannot ensure data safety, the host 50 can re-send the controller 102 a new time for the flush command timeout. In this case, the controller 102 can trigger the flush operation accordingly, making sure the data is committed to the non-volatile memory 104 under this time-out timeframe.

Figure 4:
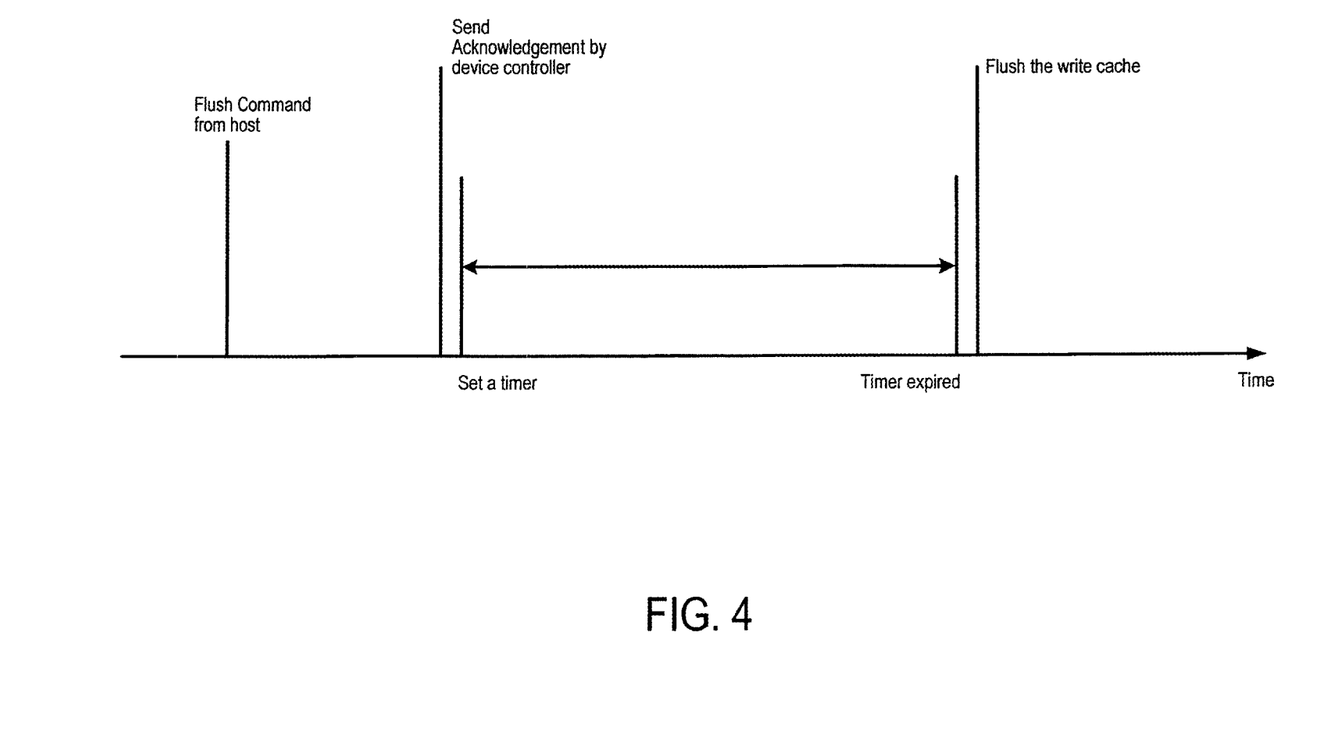
FIG. 4 is a timing diagram showing delay of execution of a flush command of an embodiment.

At the close of this time window, the controller 102 can execute the flush command. This operation is shown in the graph in FIG. 4. As shown in FIG. 4, at some point after receiving the flush command from the host 50 but before executing the flush command, the controller 102 sends an acknowledgment of the flush command to the host 50. (While the graph in FIG. 4 shows some time elapsed between receipt of the flush command and the sending of the acknowledgment, the sending of the acknowledgment can occur instantly upon receipt of the flush command.) After the acknowledgment is sent, the controller starts (sets) a timer (e.g., for a pre-defined 0.5 milliseconds time window). (While the graph in FIG. 4 shows some time elapsed between the sending of the acknowledgment and the start of the timer, the timer can start immediately after sending the acknowledgment.) As explained above, during this time window, the write cache 112 can be filled or altered, thereby improving throughput. After the timer expires, the flush operation is executed. (While the graph in FIG. 4 shows some time elapsed between the expiration of the timer and the execution of the flush command, the execution of the flush command can occur immediately after the expiration of the timer.)

Additionally or alternatively, the flush manager 111 can be configured to check the command queue 123 upon receiving a flush command and, if host write commands are found in the command queue 123, to load host write data to the write cache 112 before performing the flush command, thereby improving the device throughput. More specifically, as mentioned above, the storage system 100 in this embodiment has a command queue 123 in the host interface 120 (the command queue 123 can be located in other locations in the storage system 100). In this embodiment, the command queue 123 is configured to store write commands received from the host 50. In operation, the host 50 just sends the write command itself and waits to send the data associated with the write command until the write command is taken out of the command queue 123. When a write command is taken from the command queue 123, the associated data received from the host 50 is stored in the write cache 112.

In this embodiment, the flush manager 111 can be configured to check the command queue 123 upon receiving a flush command and, if host write commands are found in the command queue 123, to load host write data to the write cache 112 before performing the flush command. This helps "fill up" the write cache 112 with data to make a flush operation as efficient as possible. Checking the command queue 123 in this fashion can be used in conjunction with using a delay/timer to help fill-up with write cache 112 or can be used without using a delay/timer. These embodiments will now be discussed in conjunction with the flow chart 500 in FIG. 5 and the timing diagram in FIG. 6.

Figure 5:
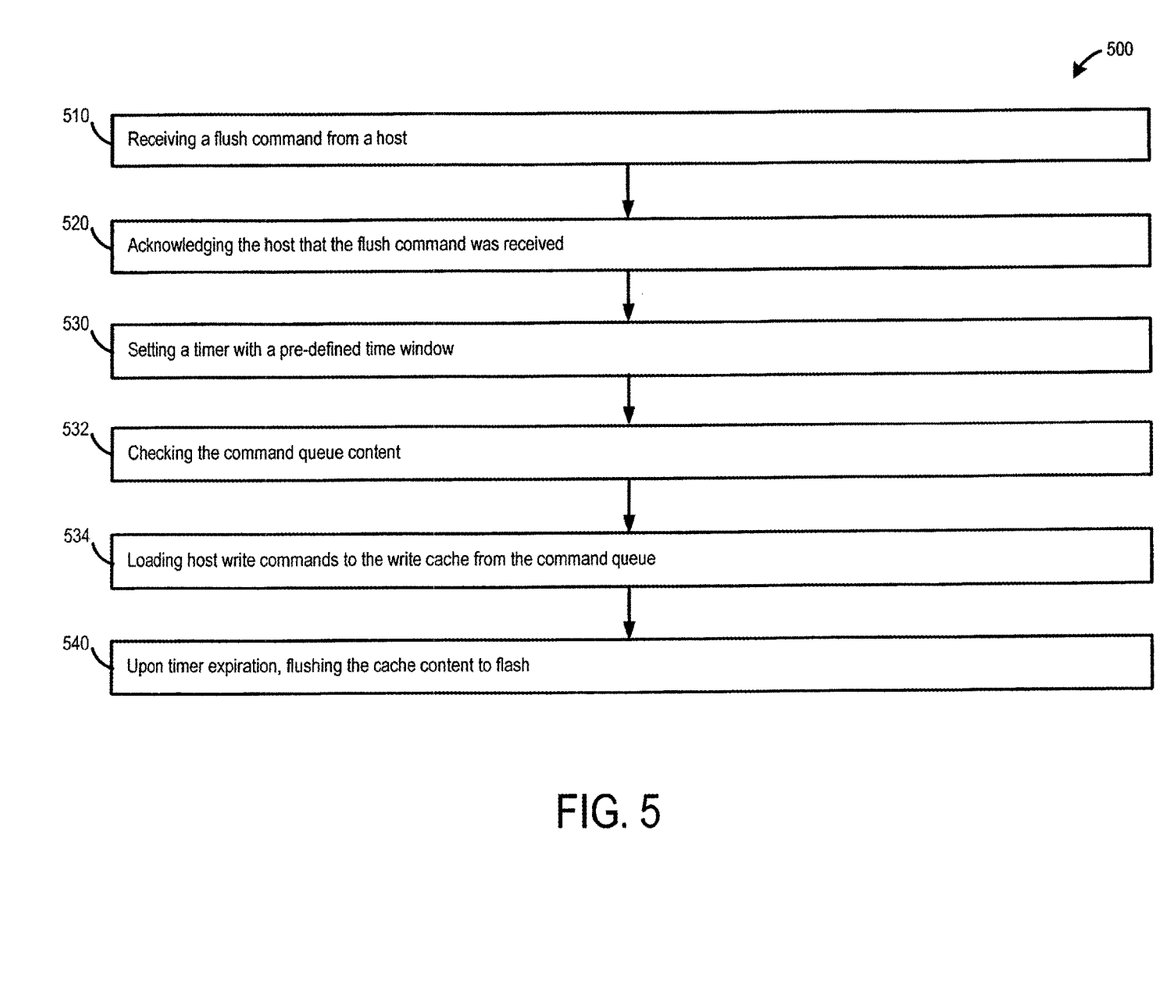
FIG. 5 is a flow chart of a method of an embodiment for flush optimization.

As shown in the flow chart 500 in FIG. 5, the controller 102 receives a flush command from the host 50 (act 510), acknowledges receipt of the flush command (act 520), sets a timer with a pre-defined time window (act 530), and, eventually, flushes the write cache 112 to the non-volatile memory 104 (here, flash). However, in this embodiment, between the setting of the timer (act 530) and executing the flush command (act 540), the controller 102 checks the command queue 123 (act 532) and loads host write commands to the write cache 112 from the command queue 123 (act 534).

Figure 6:
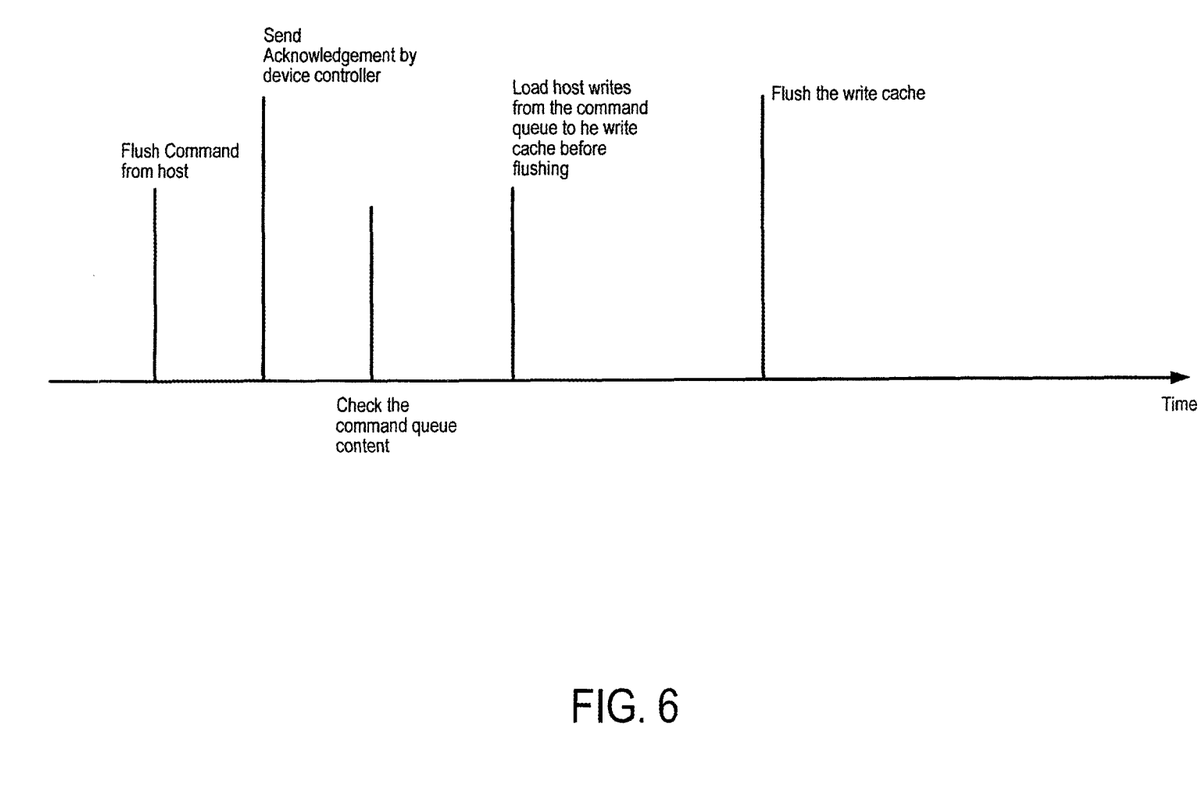
FIG. 6 is a timing diagram of an embodiment in which a command queue is checked.

The timing diagram of FIG. 6 shows a variation of the embodiment illustrated in the flow chart 500 of FIG. 5. Namely, FIG. 6 illustrates an embodiment that does not use a timer. Instead, the write cache 112 is flushed after the host writes from the command queue 123 are loaded into the write cache 112. Also, as noted above with respect to FIG. 4, there may not be much, if any, of a time gap between receiving the flush command from the host 50 and sending the acknowledgement.

Another embodiment takes into account the risk that data loss can occur if a power loss or power cycle happens after the confirmation is sent to the host 50 but before the data is actually flushed out of the volatile write cache 112 and into the non-volatile memory 104. (A shutdown operation may not run the risk of data loss if it is "graceful" and allows the storage system 100 time (e.g., a few seconds) to flush the cache 112 before removing power.) In such a situation, even though the host 50 thinks the data in the write cache 112 was reliably committed to the non-volatile memory 104, the data would actually be lost because, during power loss, the data stored in the volatile write cache 112 would be gone. This can lead to an inconsistency that is undesirable and may be in violation of the specification of the storage system 100.

To protect against such a situation, in one embodiment, the storage system 100 comprises a capacitor that is configured to hold enough charge to power the storage system 100 for more than the pre-defined time delay (e.g., for at least the length of the time delay and however long the flush operation will take if performed immediately after the time delay). That way, if there is a host power loss after the storage system 100 informs the host 50 that the flush took place (even though it did not), the storage system 100 will have enough time to ensure that the flush will take place, thus providing power immunization. As an alternate to using a capacitor, the write cache 112 can be implemented with storage class memory (SCM) in order to keep data temporarily ruggedized. In general, storage class memory is a form of non-volatile memory that is faster than flash and can be used as a replacement for DRAM. Examples of storage class memory, include, but are not limited to, phase-change memory (PCM) and resistive random access memory (ReRam)

In another embodiment, the controller 102 is configured to send the flush command confirmation/acknowledgement to the host 50 only after receiving, from the host 50, an indication that the data in the volatile memory (write cache) 112 is safe from loss due to power failure. This way, the controller 102 can be assured by the host 50 that the power loss risk is not an issue. This embodiment can be desired in situations where the specification for the storage system 100 prohibits running the risk of data loss (e.g., because such a risk would be a violation of the specification).

The indication from the host 50 can take any suitable form. For example, in one embodiment, the indication indicates that the host's battery is un-removable and the power charging level of the host's battery. In some embodiments, satisfaction of these two conditions can allow the storage system 100 to consider the volatile write cache 112 as a "non-volatile storage area" (because data is safe from power failure), and, hence "legal"/not in violation of the storage system's specification.

The indication that the host's battery is un-removable means that a user cannot remove the battery or that the battery cannot fall out of the host 50 accidentally, such as when the host 50 is dropped and the battery pops out. In some embodiments, an "un-removable" battery can be removed by a service technician (e.g., using special tools). Accordingly, "un-removable" in this context means un-removable by a typical user (on purpose and/or on accident) in operation of the host 50—not necessarily un-removable under all possible conditions. The indication that the host's battery is un-removable can be programmed into the storage system 100 during formatting and can be provided to the storage system 100 one or more times after power up.

The indication of the power charging level of the host's battery can be an indication from the host 50 that the power charging level of the host's battery is above a threshold considered high enough to assure the storage system 100 that there will not be a power loss from the host 50 prior to the storage system 100 later executing the flush command (i.e., the host 50 can compare the power charging level to a threshold). Alternatively, the indication of the power charging level of the host's battery can be the actual power charging level of the host's battery, and the storage system 100 can be responsible for comparing the power charging level to a threshold to determine if there's enough power to ensure against data loss from power loss.

Regarding the power charging level, as noted above, the host 50 can send the controller 102 the amount of time that the controller 102 should delay before executing the flush command. In this way, if the host's power condition is such that it cannot ensure providing the storage system 100 with power for an extended time (e.g., based on the power charging level), the host 50 can set the delay to be within the amount of time it knows it can provide power for the storage system 100 to commit the data to the non-volatile memory 104. Also, if the host 50 knows that it cannot ensure data safety (e.g., based on the power charging level), the host 50 can re-send the controller 102 a new time for the flush command timeout. In this case, the controller 102 can trigger the flush operation accordingly, making sure the data is committed to the non-volatile memory 104 under this timeout timeframe.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:
1. A storage system comprising:
a cache;
a non-volatile memory; and
a controller in communication with the cache and the non-volatile memory, wherein the controller is configured to:
store, in the cache, data received from a host and to be written in the non-volatile memory;
receive a command from the host to move the data stored in the cache into the non-volatile memory;

without having executed the command, send a confirmation to the host that the command was executed; and execute the command after sending the confirmation to the host, wherein the controller is configured to send the confirmation to the host only after receiving, from the host, an indication that the data in the cache is safe from loss due to power failure.

2. The storage system of claim 1, wherein the indication indicates that the host's battery is un-removable and indicates the power charging level of the host's battery.

3. The storage system of claim 1, wherein the controller is configured to execute the command after an expiration of a time delay.

4. The storage system of claim 3 further comprising a capacitor configured to hold enough charge to power the storage system for more than the time delay.

5. The storage system of claim 3, wherein a length of the time delay is set by the host.

6. The storage system of claim 1, wherein the cache comprises storage class memory.

7. The storage system of claim 1 further comprising a write command queue, and wherein the controller is further configured to:

prior to executing the command to move the data:
   determine if there is a write command in the write command queue; and
   in response to determining there is a write command in the write command queue, store, in the cache, data associated with the write command.

8. The storage system of claim 1, wherein the non-volatile memory comprises a three-dimensional memory.

9. The storage system of claim 1, wherein the storage system is embedded in the host.

10. The storage system of claim 1, wherein the storage system is removably connected to the host.

11. A method for executing a flush command, the method comprising:

performing the following in a storage system in communication with a host, wherein the storage system comprises a write cache:
   receiving a command from the host to flush the write cache;
   sending an acknowledgement to the host that the cache was flushed even though the write cache was not flushed;
   after a period of time after sending the acknowledgement, flushing the write cache, wherein the data flushed from the write cache after the period of time is different from the data that would have been flushed if the write cache was flushed prior to sending the acknowledgement; and
   before sending the acknowledgement, receiving an indication from the host that the data in the write cache will not be lost due to power failure.

12. The method of claim 11, wherein the indication indicates that the host's battery is un-removable and indicates the power charging level of the host's battery.

13. The method of claim 11 further comprising prior to flushing the write cache:

determining if there is a write command in a write command queue in the storage system; and in response to determining there is a write command in the write command queue, storing, in the write cache, data associated with the write command.

14. The method of claim 11, wherein the write cache is flushed into a non-volatile, three-dimensional memory of the storage system.

15. The method of claim 11, wherein the storage system is embedded in the host.

16. The method of claim 11, wherein the storage system is removably connected to the host.

17. A storage system comprising:

a cache;

a non-volatile memory; and means for sending a confirmation of execution of a flush command to a host even though the flush command was not executed, wherein the confirmation is sent after receiving, from the host, an assurance that there will not be a power loss from the host prior to the storage system later executing the flush command.

18. The storage system of claim 17, wherein the assurance comprises an indication that indicates that the host's battery is un-removable and the power charging level of the host's battery.

19. The storage system of claim 17, wherein the non-volatile memory comprises a three-dimensional memory.

\* \* \* \* \*